(12) United States Patent
Maulik et al.

(10) Patent No.: US 6,260,053 B1
(45) Date of Patent: Jul. 10, 2001

(54) EFFICIENT AND SCALABLE FIR FILTER ARCHITECTURE FOR DECIMATION

(75) Inventors: Prabir C. Maulik; Chadha S. Mandeep; Zhao Kan, all of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/208,218

(22) Filed: Dec. 9, 1998

(51) Int. Cl.[7] .............................. G06F 17/17; G06F 17/10
(52) U.S. Cl. ............................................. 708/313; 708/319
(58) Field of Search ..................................... 708/300, 301, 708/313, 316, 319

(56) References Cited

U.S. PATENT DOCUMENTS

| | | |
|---|---|---|
| 4,584,701 | 4/1986 | Nakama et al. . |
| 5,339,264 * | 8/1994 | Said et al. ............................ 708/319 |
| 5,369,710 | 11/1994 | Asai . |
| 5,555,516 | 9/1996 | Zook . |
| 5,563,819 | 10/1996 | Nelson . |
| 5,592,404 | 1/1997 | Zook . |
| 5,689,571 | 11/1997 | Kitamura . |
| 5,717,619 | 2/1998 | Spurbeck et al. . |
| 5,719,572 | 2/1998 | Gong . |
| 5,719,573 | 2/1998 | Leung et al. . |
| 5,729,229 | 3/1998 | Kasha et al. . |
| 5,910,908 * | 6/1999 | Slavin ................................... 708/313 |

FOREIGN PATENT DOCUMENTS

| | | |
|---|---|---|
| 0 422 955 | 4/1991 | (EP) . |
| 0 480 561 | 4/1992 | (EP) . |
| 8-160982 | 6/1996 | (JP) . |
| WO 98/11530 | 3/1998 | (WO) . |

* cited by examiner

*Primary Examiner*—Chuong Dinh Ngo
(74) *Attorney, Agent, or Firm*—Ken J. Koestner; Skjerven, Morrill, Macpherson

(57) ABSTRACT

A scalable FIR filter architecture that requires fewer computations, less storage registers, and is capable of parallel processing, is presented. The scalable filter architecture reduces the number of computations (e.g., multiplication) by utilizing the inherent symmetry and reduces the number of storage elements required by utilizing what is known as the transpose-form (as compared to direct-form) filter architecture. The filter architecture is scalable to accommodate different complexity levels. In accordance to the present invention, a filter can be scaled up/down by adding/subtracting a processing block to/from the existing structure. Because these processing blocks can process signals independently and simultaneously, the filter architecture in accordance to the present invention allows for parallel and distributive processing thereby meeting the required performance requirements.

14 Claims, 13 Drawing Sheets

<u>Computation sequence</u>

STEP 1)   tmp1 = h(2)x(n-1)
STEP 2)   tmp2 = tmp1 + st1
STEP 3)   st1 = tmp1 + st0
STEP 4)   tmp1 = h(0)x(n-1)
STEP 5)   out = tmp1 + st2
STEP 6)   st2 = tmp2
STEP 7)   st0 = tmp1
STEP 8)   tmp1 = h(1)x(n)
STEP 9)   st0 = st0 + tmp1
STEP 10)  st2 = st2 + tmp1

EFFICIENT AND SCALABLE FIR FILTER ARCHITECTURE FOR DECIMATION

BACKGROUND OF THE INVENTION

1. Field of the Invention

The present invention relates to signal processing systems. More specifically, the invention relates to filtering systems for usage in various applications including decimators.

2. Description of the Related Art

Signal processing systems often include digital filters for performing various filtering operations. Digital filters are classified into two types, infinite impulse response (IIR) filters and finite impulse response (FIR) filters. FIR filters are commonly used to perform digital filtering functions. For causal systems with finite-duration impulse responses, filters generally process an input signal according to a nonrecursive computational algorithm.

Accordingly, digital filters generally perform a large number of computations (e.g., multiplication) and require a large number of storage elements (e.g., registers) for temporarily storing computed variables (e.g., state variables) in carrying out the computations. The number of storage elements and computations carried out by a digital filter directly effects the device's size, speed, and power consumption. As the complexity of digital filters increase, the number of computation and the number of registers required tend to increase. At the same time, improved performance is continually expected from digital filters.

For these reasons, it is desirable to improve the computational efficiency and speed (e.g., reduce the number of computations) and reduce the number of storage elements required in FIR filters. It is also desirable to have a scalable filter architecture that can accommodate different complexity levels and be capable of achieving the required performance.

SUMMARY OF THE INVENTION

The present invention provides a method, apparatus, and system to provide a filter architecture that is computationally efficient, requires fewer storage elements, and is scalable to accommodate different complexity levels while still achieving the required performance.

The present invention meets the above need with a scalable Finite Impulse Response (FIR) filter comprising at least one linear-phase decimation-by-2 processing element. The FIR filter can provide scalable processing capability by connecting a plurality of substantially similar linear-phase decimation-by-2 processing elements together in series such that the substantially similar processing elements are configurable to operate independently and in parallel. Each processing element is in transpose form. Each processing element utilizes coefficient symmetry to reduce the number of multiplication operations. Each processing element utilizes the transpose form to reduce the number of state variable storage elements. Each processing element has a first and second sets of predetermined coefficients.

Under the present invention, the configuration and interconnection between the processing elements are as follows. The first processing element in the series computes a first value based on the first set of predetermined coefficients of the first processing element and the samples of the input signal. If the first processing element is connected to a subsequent neighbor processing element, the first processing element provides the first value to the subsequent neighbor processing element and receives a second value from the subsequent neighbor processing element. The first processing element computes a third value based on the second value, the second set of predetermined coefficients of the first processing element, and the samples of the input signal. If the first processing element is not connected to a subsequent neighbor processing element, the first processing element computes the third value based on the first value, the second set of predetermined coefficients of the first processing element, and the samples of the input signal. The subsequent neighbor processing element computes a fourth value based on the first value received from the first processing element, a first set of predetermined coefficients of the subsequent neighbor processing element, and the samples of the input signal. If the subsequent neighbor processing element is connected to another subsequent neighbor processing element, the subsequent neighbor processing element provides the fourth value to the another subsequent neighbor processing element and receives a fifth value from the another subsequent neighbor processing element. The subsequent neighbor processing element computes the second value based on the fifth value, a second set of predetermined coefficients of the subsequent neighbor processing element, and the samples of the input signal. If the subsequent neighbor processing element is not connected to the another subsequent neighbor processing element, the subsequent neighbor processing element computes the second value based on the fourth value, a second set of predetermined coefficients of the subsequent neighbor processing element, and the samples of the input signal. The scalable filter architecture in accordance with the present invention may include a large number of processing elements.

All the features and advantages of the present invention will become apparent from the following detailed description of its preferred embodiment whose description should be taken in conjunction with the accompanying drawings.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DESCRIPTION OF THE PREFERRED EMBODIMENT(S)

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Under the present invention, a scalable finite impulse response (FIR) filter architecture is presented. The scalable filter architecture reduces the number of computations (e.g., multiplication) by utilizing the inherent symmetry and reduces the number of storage elements required by utilizing what is known as the transpose-form (as compared to direct-form) filter architecture. The filter architecture is scalable to accommodate different complexity levels. In accordance to the present invention, a filter can be scaled up/down by adding/subtracting a processing block to/from the existing structure. Because these processing blocks can process signals independently and simultaneously, the filter architecture in accordance to the present invention allows for parallel and distributive processing thereby meeting the required performance requirements.

Figure 1:
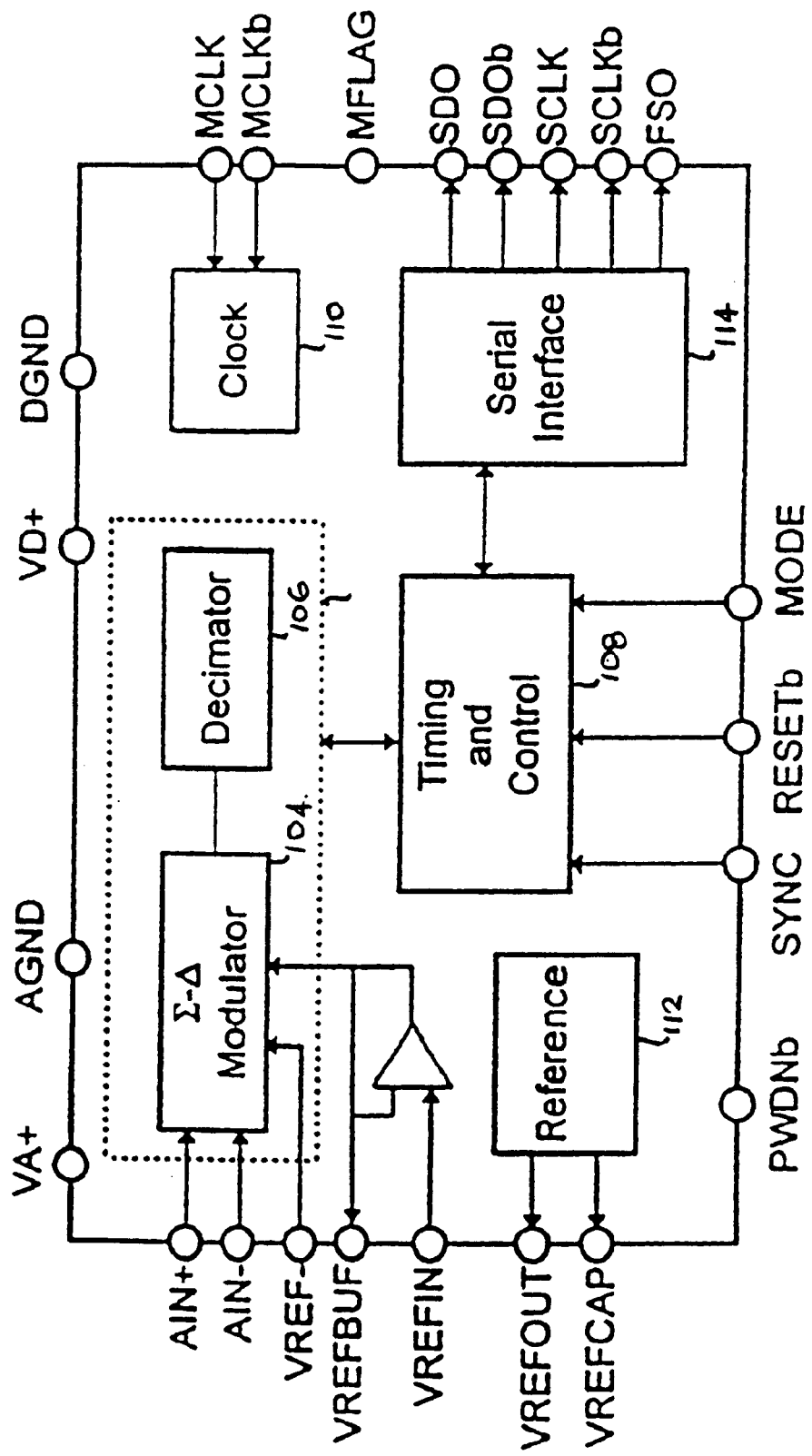
FIG. 1 is a block diagram illustrating an exemplary analog-to-digital converter (ADC) integrated circuit 100 which implements the present invention.

Referring now to FIG. 1 illustrating analog-to-digital converter (ADC) integrated circuit 100 which implements the present invention. ADC 100 is a fully-calibrated high-speed delta-sigma ADC that reaches a 400 ksample/second output word rate. ADC 100 comprises delta-sigma modulator 104, decimation filter 106, timing & control circuit 108, clock circuit 110, voltage reference circuit 112, and serial interface circuit 114.

In general, delta-sigma modulation makes use of oversampling and digital signal processing to achieve a high level of accuracy in converting an analog signal into a digital signal. Using oversampling, delta-sigma modulator 104 converts a differential input analog signal (AIN+ and ANI-) to a digital signal wherein noise is channeled away from a particular frequency band. The digital signal is then provided to decimation filter 106 which reduces the sampling frequency to a desired rate for a given application (e.g., the Nyquist frequency). Decimation filter 106 also filters out the quantization noise and excess aliasing introduced during the sampling rate reduction (a.k.a. subsampling). Because such filtering is performed at a high rate, decimation filter 106 needs to be computationally efficient. In the present embodiment, decimation filter 106 incorporates the present invention.

Clock circuit 110 is connected to a master clock pin MCLK and an inverse master clock pin MCLKb for receiving master clock signals. Clock circuit 110 supplies the clock signal for ADC 100. In one embodiment, ADC 100 is designed to operate at a master clock rate of 25.6 MHz. It should be clear to a person of ordinary skill in the art that other alternative master clock rates may also be used. Voltage reference circuit 112 supplies the required reference voltage of +2.5V to ADC 100.

In general, timing & control circuit 108 provides the desired timing for the digital signal generated by ADC 100. Using the RESETb input signal, timing & control circuit 108 is used to reset ADC 100 at the beginning of a convolution cycle. Moreover, the SYNC input signal can be used to synchronize ADC 100 with other ADCs in a system. THE PWDNb signal is used to control the power mode of ADC 100 (e.g., enabling/disabling the low-power mode).

Serial interface circuit 114 provides the interface to allow the digital signal generated by ADC 100 to be serially communicated to an external device. Serial interface circuit 114 outputs 16-bit serial data words at pin SDO. Serial interface circuit 114 also outputs the complement of the 16-bit serial data words at pin SDOb. When used in combination, the 16-bit serial data words and their complements reduce radiated noise if the two lines are run adjacent on a PC trace layout. Serial interface 114 also outputs a frame sync output signal (FSO) and a serial clock signal (SCLK). Serial clock signal SCLK and its complement signal SCLKb are supplied to similarly reduce radiated noise.

In the present embodiment, the 16-bit serial data words are transmitted such that the Most Significant Bit (MSB) is output first and the Least Significant Bit (LSB) is output last. The complementary serial clock output signals SCLK and SCLKb produce a serial clock output signal that is one-third the master clock MCLK rate. The SDO and SDOb bits are valid on the rising edge of the serial clock output signal SCLK. The frame sync output (FSO) signal is used to indicate the beginning of a serial data output word. More particularly, the FSO signal produces a framing pulse that is LOW for the duration of the sixteen data bits of serial data output from SDO.

Figure 2:
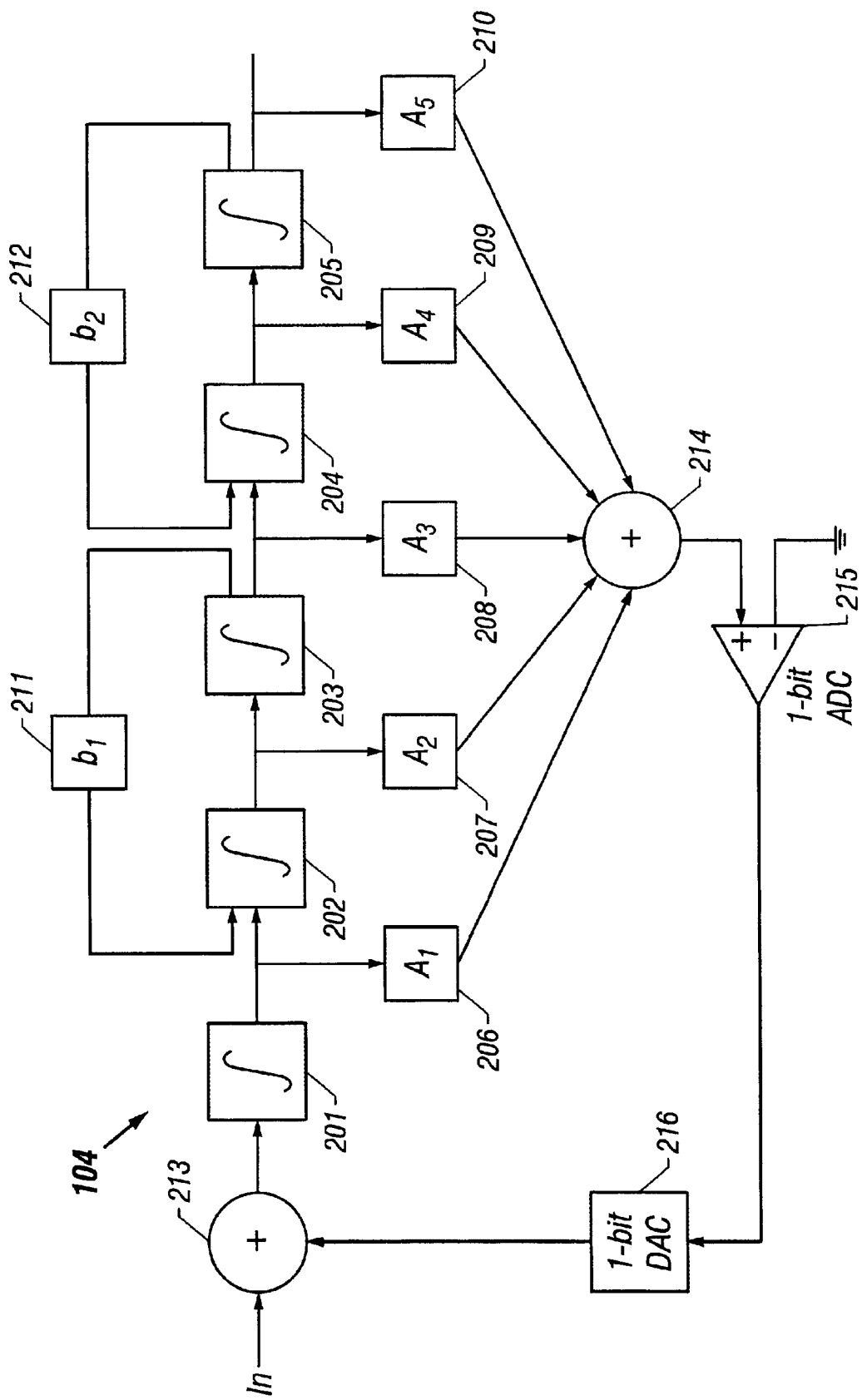
FIG. 2 is a block diagram illustrating an exemplary embodiment of delta-sigma modulator 104 in FIG. 1.

Referring to FIG. 2 illustrating in greater detail an exemplary embodiment of delta-sigma modulator 104. Delta-sigma modulator 104 is a fifth-order delta-sigma modulator that is capable of handling input analog signals of higher frequencies. Generally, a delta-sigma modulator carries out an analog-to-digital conversion wherein "quantization noise" can be eliminated without affecting the frequency band of interest. Because oversampling is involved, a delta-sigma modulator typically requires a high rate of data processing (computation). Accordingly, delta-sima modulator 104 is primarily analog in nature. As shown in FIG. 2, delta-sigma modulator 104 comprises integrators 201–205, multipliers 206–212, adders 213–214, ADC 215, and DAC 216. Adder 213 receives as inputs signal AIN+ and the output of delta-sigma modulator 102. The output of adder 213 is provided as input to integrator 201 whose output is provided as input to integrator 202. In short, integrators 201–205 are coupled together in series such that the output of the previous integrator in line is provided as input to the next integrator in line. The output of integrator 203 is also provided as input to multiplier 206 which multiplies its input by a factor $B_1$ before supplying it as a second input to integrator 202 thereby establishing a feedback loop. Similarly, the output of integrator 205 is also provided as input to multiplier 207 which multiplies its input by a factor $B_2$ before supplying it as a second input to integrator 204 thereby establishing a feedback loop.

The outputs of integrators 201–205 are provided as input to multipliers 208–212, respectively. Multipliers 208–212 multiply their input by gain factors $A_1$, $A_2$, $A_3$, $A_4$, and $A_5$, respectively, prior to sending the results to adder 214 which adds up all its inputs and provides the summing signal as its output to ADC 215. ADC 215 is a 1-bit analog-to-digital converter which, in the current embodiment, is a comparator circuit. The output of adder 213 is provided to the non-invert terminal of the comparator circuit. The invert terminal of the comparator circuit is connected to Ground. Operationally, the comparator circuit outputs a value "0" if the output of adder 213 is positive and outputs a value "1" if the output of adder 213 is negative. The use of such a analog-to-digital converter is necessary in the implementation of a digital filter such as digital decimation filter 106. The output of ADC 215 is the output of delta-sigma modulator 104 and is provided as an input to digital decimation filter 106. However, because the output of delta-sigma modulator 104 is provided as a feedback signal to adder 213, DAC 216 is used to convert the feedback signal back to analog domain before sending it to adder 213. Accordingly, DAC 216 is a 1-bit digital-to-analog converter. Adder 213 subtracts the analog input signal AIN+ from the feedback signal output signal and provides the resulting signal to integrator 201 as an input. In so doing, a delta-sigma modulator having an analog negative feedback loop with a high open loop gain is implemented.

Operationally, integrators 201–205 are designed to carry out the analog filtering to reduce the quantization noise (error), which may be created by the operation of ADC 215, in the frequency band of interest. The quantization noise is reduced by shaping the noise spectrum away from the frequency band of interest while minimizing any adverse effect on the spectrum of the analog input signal (AIN+). Essentially, the quantization noise is pushed out of the frequency band of interest and to higher frequencies where a lowpass filter like digital decimation filter 106 can be used to eliminate the quantization noise. Hence, gain factors $A_1$–$A_5$ are selected to help in reducing the quantization noise from the output of delta-sigma modulator 104.

Figure 3:
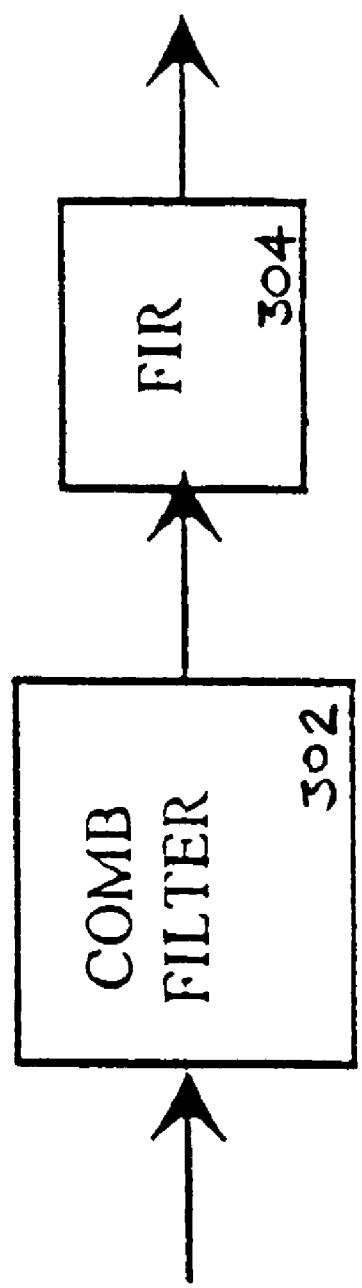
FIG. 3 is a block diagram illustrating an embodiment of digital decimation filter 106 which implements the present invention.

FIG. 3 is a block diagram illustrating an embodiment of digital decimation filter 106 which implements the present invention. As shown in FIG. 3, digital filter 106 includes comb filter 302 and finite impulse response (FIR) filter 304. Digital filter 106 is designed to filter out quantization error/noise that may occur from the analog-to-digital conversion. Digital filter 106 is also designed to downsample (i.e., decimate) the high sampling (i.e., oversampling) rate carried out by delta-sigma modulator 104 to a lower sampling rate as well as to filter out aliasing that may occur during downsampling. Digital decimation filter 106 is a multiple-stage filter wherein each stage has a different decimation factor. For example, comb filter 302 has a decimation factor of 32 and FIR filter 304 has a decimation factor of 2. In the current embodiment, digital decimation filter 106 receives as input a one-bit stream having a sampling rate of 25.6 MHz from delta-sigma modulator 104 and provides an output signal having a sample rate of 400 kHz.

Comb filter 302 implements a ninth-order sinc function. A sinc function is well-known in the art and therefore is not discussed further here. Filter 304, which incorporates the present invention, is a linear phase transpose-form FIR filter. FIR filter 304 computes an output signal that is based on only a finite number of samples of an input signal. More particularly, FIR filter 304 computes the output signal based on the weighted average of a sequence of input samples. Application of the weighting function enables the digital filter 106 to assemble an N-bit output signal with $2^N$ possible values without incurring a latency of $2^N$ samples.

In accordance with the present invention, the efficiency of FIR filter 304 is improved by taking advantages of the symmetry of the FIR filter's coefficients to reduce the amount of computation (e.g., multiplication) and by using a transpose form to reduce the number of variable registers required. By implementing the FIR filter in transpose-form, the number of state variable registers can be reduced by a factor equal to the decimation ratio. Moreover, by exploiting the symmetry of the coefficients, the number of multiplications can be halved. Thus, decimation-by-two FIR filter 304 under the present invention performs half the number of multiplications and is implemented with half the number of registers compared to conventional decimation-by-two FIR filters. The FIR filter architecture in accordance to the present invention allows long filters to be implemented in parallel-processing blocks which incorporate functional units such as multipliers and adders. In other words, any arbitrarily long filter can be implemented simply by including additional processing blocks. The resulting structure is therefore highly efficient and scalable.

Figure 4:
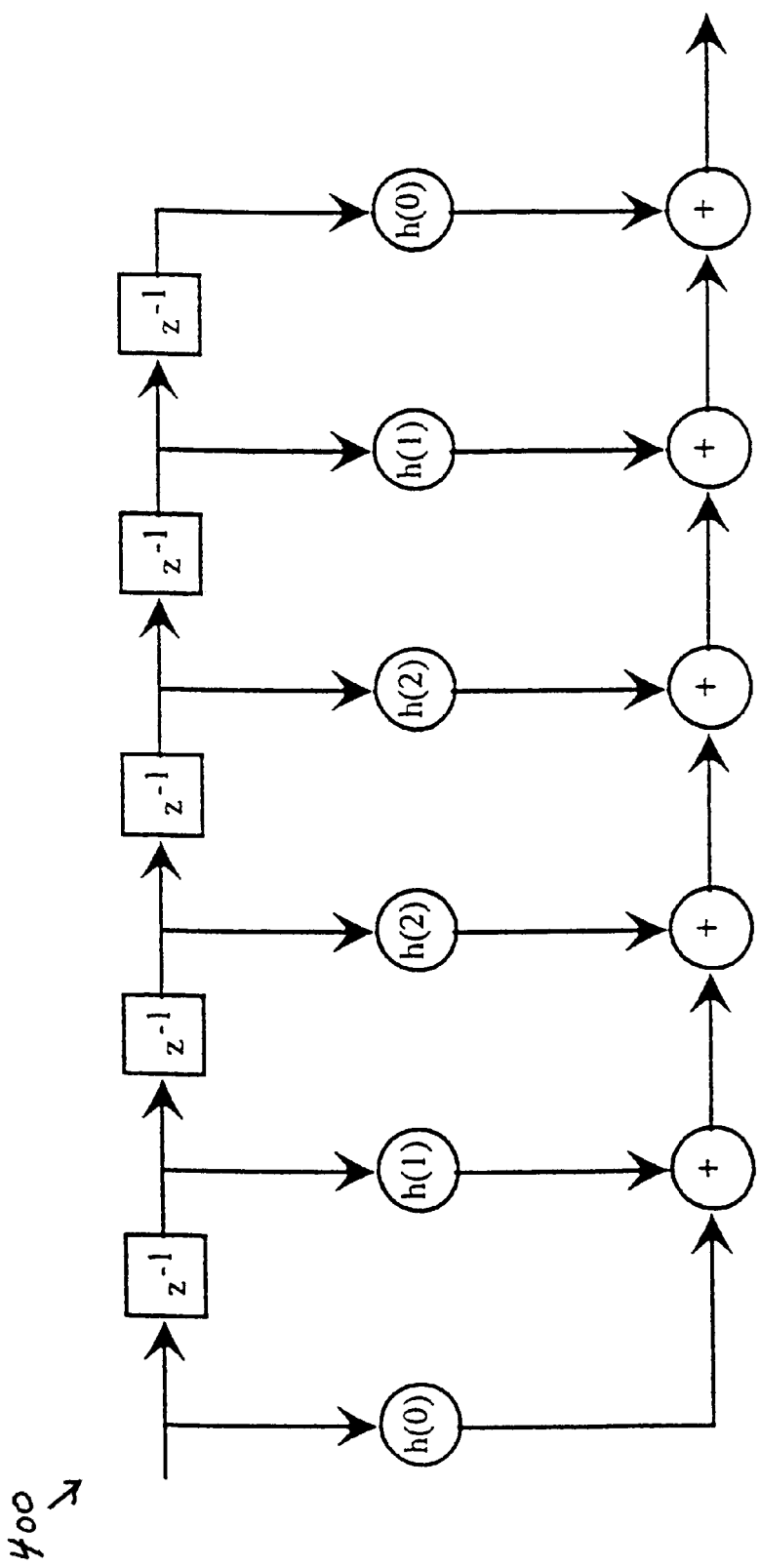
FIG. 4 illustrates the computational operations in a conventional direct-form non-decimation filter.

Reference is now made to FIG. 4 illustrating, as an example, the operations in a conventional direct-form non-decimation filter 400 which is determined from the general convolution equation:

$$y(n) = \sum_{k=0}^{N-1} h(k)x(n-k)$$

In particular, filter 400 is a linear phase FIR filter in which $5 \geq k \geq 0$. By definition, a linear phase filter has symmetrical coefficients. Accordingly, the transfer equation of filter 400 is:

$$H(z) = h(0) + h(1)z^{-1} + h(2)z^{-2} + h(2)z^{-3} + h(1)z^{-4} + h(0)z^{-5}$$

As shown in FIG. 4, the computation operations of direct-form filter 400 is based directly on the above transfer equation. In other words, multiplication symbols, addition symbols, and delay symbols are arranged to indicate that the input signal x(n) and its delays are multiplied by their corresponding coefficients with the partial results summed up and stored to ultimately provide the output signal y(n) according to the transfer equation above.

Figure 5:
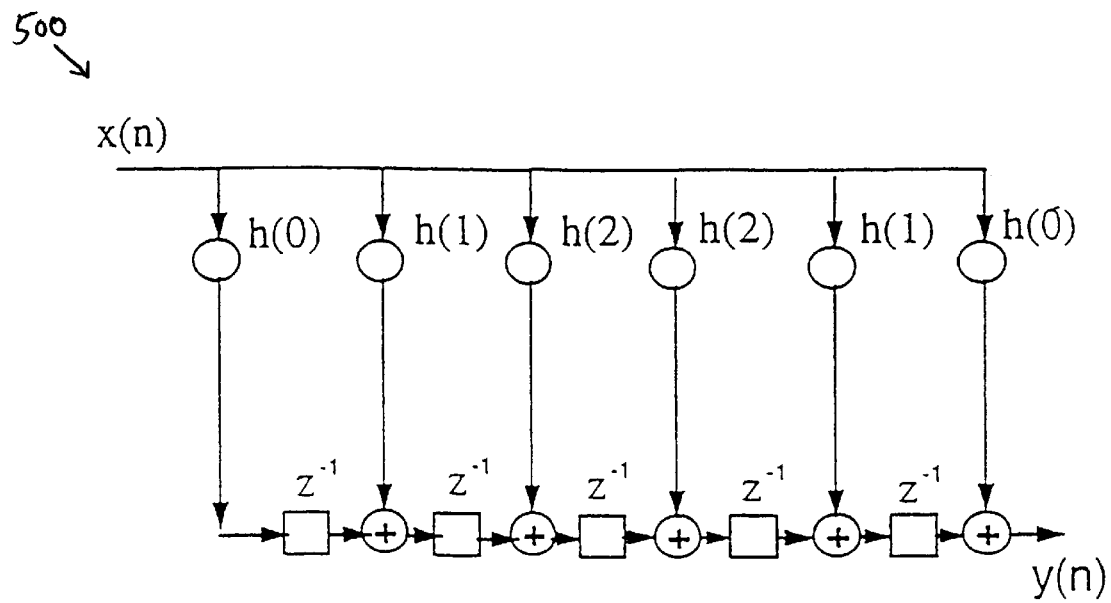
FIG. 5 illustrates the computational operations in transpose-form non-decimation filter 500.

Referring to FIG. 5 illustrating the computational operations in transpose-form non-decimation filter 500. While filter 500 is functionally identical to filter 400, its structure is in transpose-form rather than in direct-form as its counterpart. In general, a transpose-form filter is derived from a direct-form filter by transforming the signal flow graph between the input terminal and the output terminal while maintaining the original transmission defined between the input and output terminal. In one specific example, the transpose form is formed through flow-graph reversal or transposition in which the directions of all branches in a flow graph are reversed. In spite of these changes, the transfer equation H(z) for transpose-form non-decimation filter 500 is identical to that of direct-form non-decimation filter 400.

Figure 6:
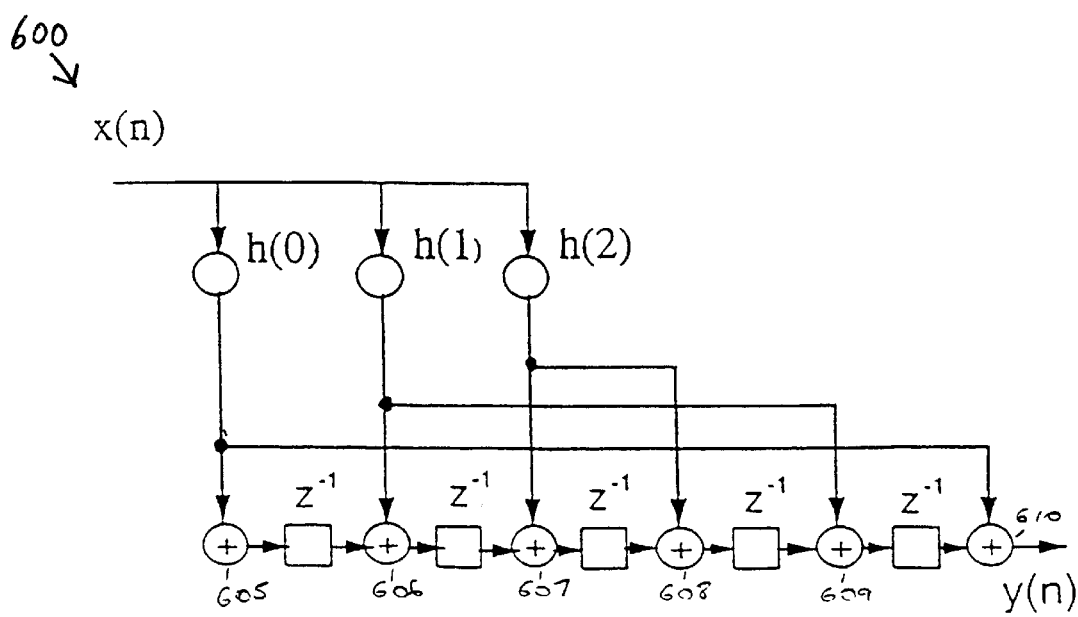
FIG. 6 illustrates the computational operations of transpose-form linear phase FIR filter 600, which is the equivalent of transpose-form filter 500 shown in FIG. 5.

FIGS. 4–5 are used as references to more clearly illustrate the concept of using coefficient symmetry to reduce the number of multiplications required in accordance to the present invention. Referring now to FIG. 6 illustrating the computational operations of transpose-form linear phase FIR filter 600, which is the equivalent of transpose-form filter 500. As shown in FIG. 6, filter 600 takes advantage of the coefficient symmetry to reduce the number of multiplications typically required in a linear phase FIR filter. More particularly, the number of multiplications is reduced in half by reusing the products (x(n)*h(0), x(n)*h(1), and x(n)*h2)) thereby eliminating half of the multiplication operations that were required in filter 500. Such reuse is possible because of the symmetry in the coefficient sequence (h(0), h(1), h(2), h(2), h(1), and h(0)) that is involved in FIR filter 600. Because the same products (x(n)*h(0), x(n)*h(1), and x(n)*h(2)) are needed for addition operations 605–607 as well as for addition operation 608–610, there is no need to repeat the same multiplication operations.

Figure 7:
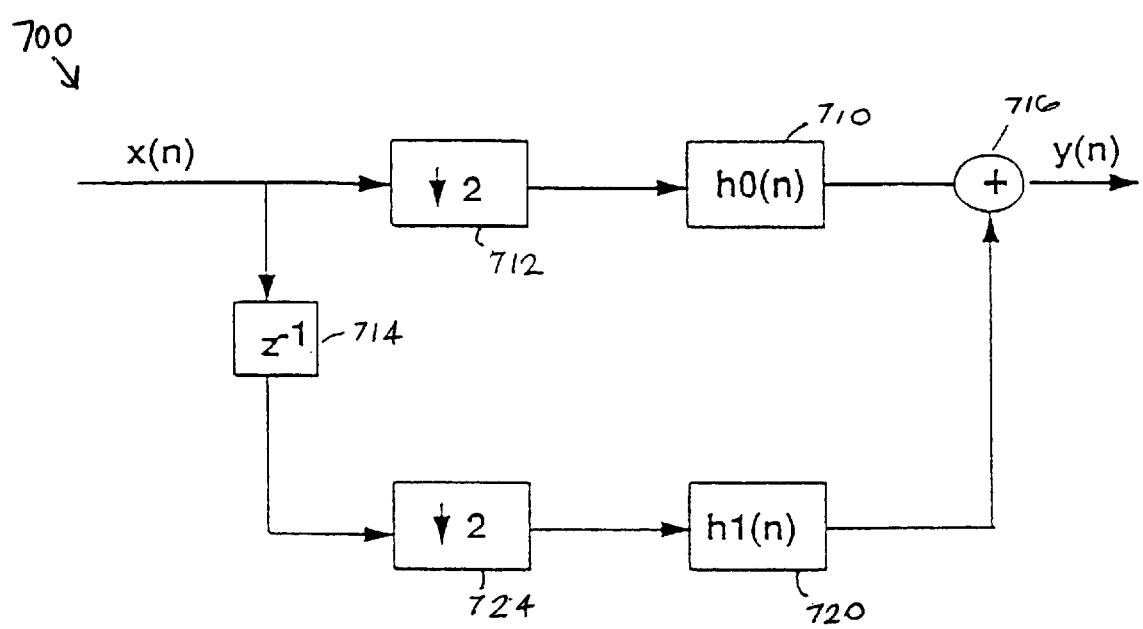
FIG. 7 illustrates a high-level block diagram of an exemplary decimation-by-two polyphase filter 700.

FIG. 7 illustrates a high-level block diagram of a decimation-by-two polyphase filter 700. As shown in FIG. 7, decimation-by-two polyphase filter 700 consists of decimator 712, component filter 710, delay 714, decimator 724, component filter 720, and adder 716. Decimators 712 and 724 both can reduce the sample rate of the input signal x(n) by a factor of two (2). It can be easily observed that in a decimation-by-two filter, a particular input multiplies only alternate coefficients during its passage through the filter thereby reducing the sample rate by a factor of two (2). Accordingly, filter 700 consists of two paths that are out-of-phase with each other wherein each path includes a decimator and a component filter. The out-of-phase dual paths allow coefficient multiplication operations to be carried out during sequential samples. If the original filter is odd-order, the component filters also have symmetric coefficients.

The first path includes decimator 712 and component filter 710. The second path, which includes decimator 724 and component filter 720, further includes delay circuit 714 to provide the desired delay (phase lag) to the second pipeline's input signal. The outputs from the two pipelines are provided to adder 716 which computes the sum and provides it as output signal y(n). The equation for the transpose-form decimation-by-two polyphase filter 700 is:

$$H(z)=h(0)+h(1)z^{-1}+h(2)z^{-2}+h(3)z^{-3}+h(4)z^{-4}+h(5)z^{-5}+h(4)z^{-6}+h(3)z^{-7}+h(2)z^{-8}+h(1)z^{-9}+h(0)z^{-10}.$$

Figure 8:
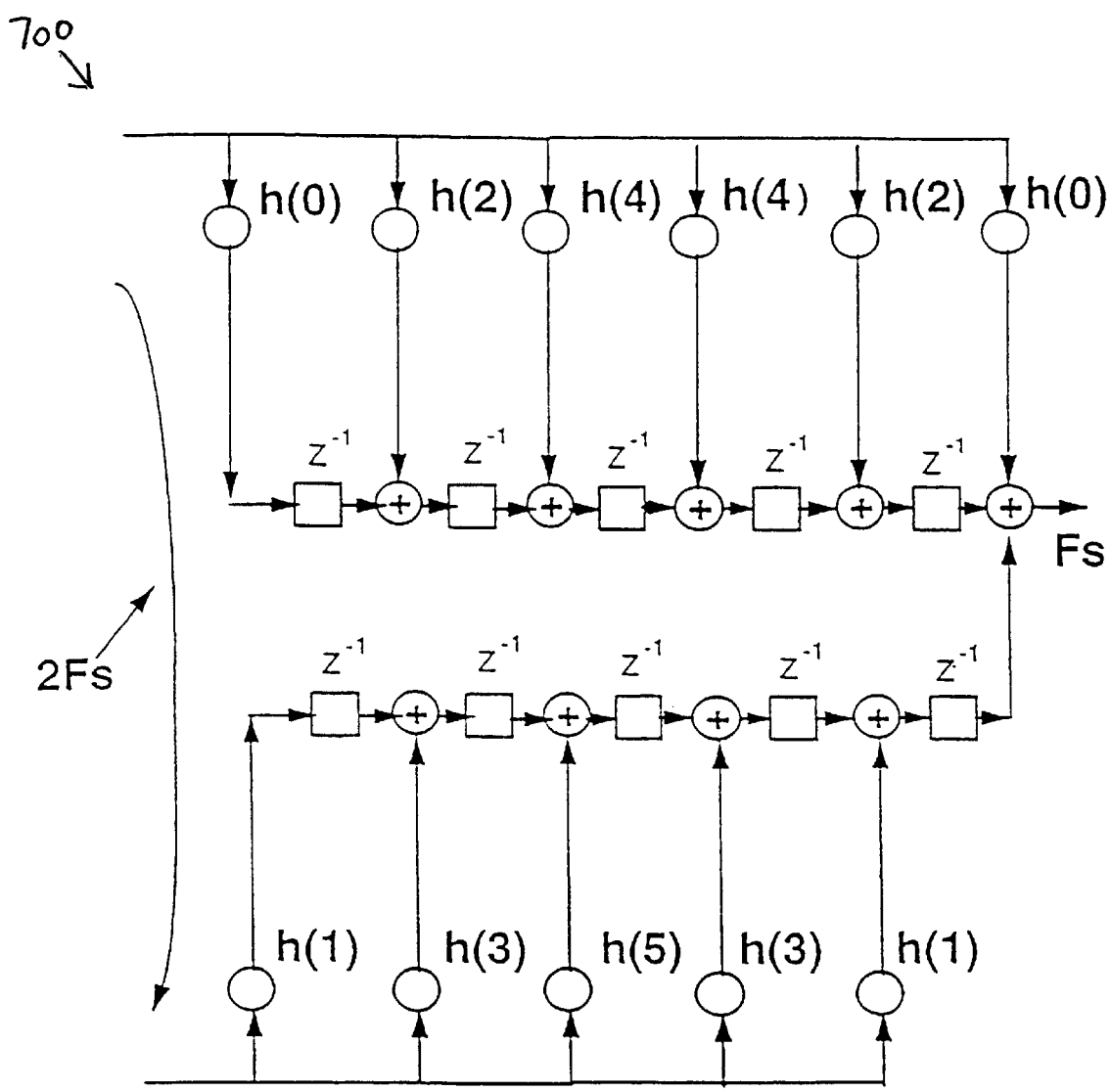
FIG. 8 illustrates, as an example, in greater detail the operations of decimation-by-two polyphase filter 700.
Figure 9:
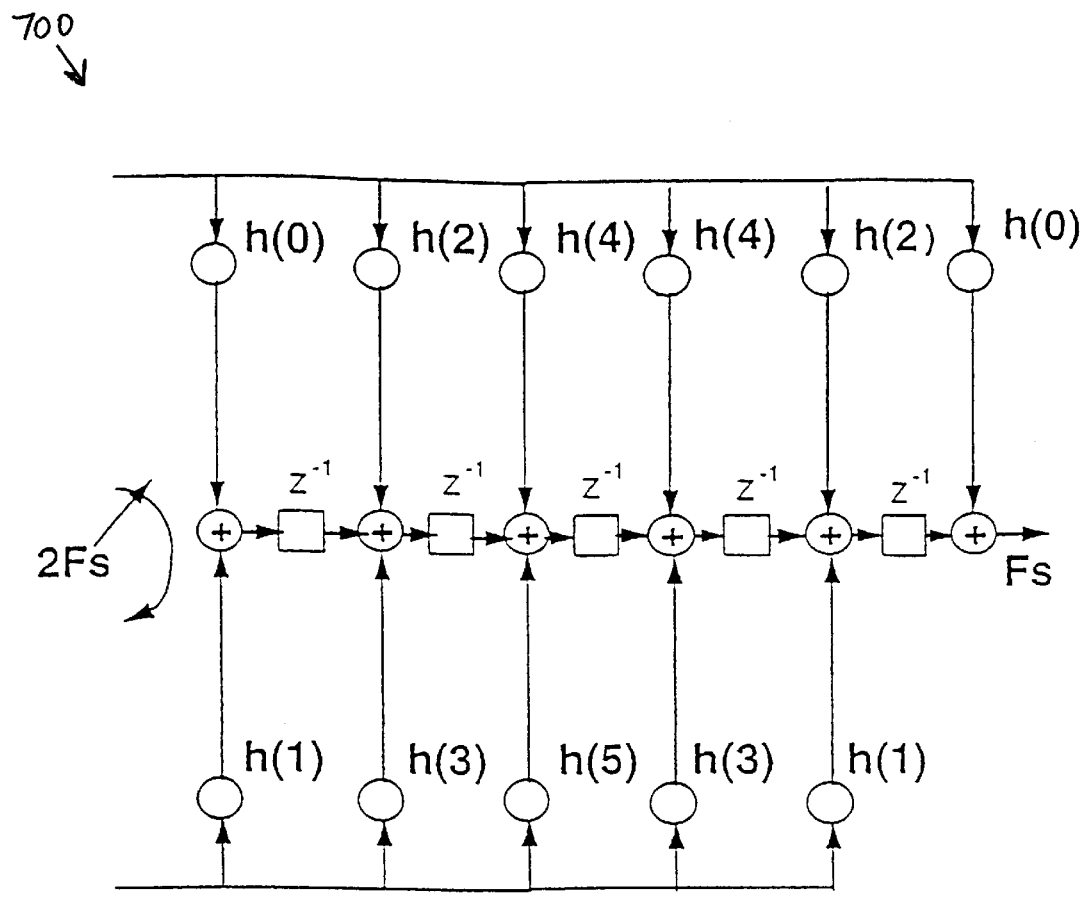
FIG. 9 illustrates the operations of decimation-by-two polyphase filter 700 having a reduced number of storage registers in accordance with one aspect of the present invention.

Referring now to FIG. 8 illustrating, as an example, in greater detail the operations of decimation-by-two polyphase filter 700. As discussed in FIG. 7, filter 700 has two paths each of which includes a linear-phase filter whose order is odd. Hence, the coefficients are symmetrical as shown in FIG. 8. Moreover, polyphase filter 700 is in transpose-form. However, for clarity, polyphase filter 700 is shown not to take advantage of its coefficient symmetry to reduce the number of multiplications required. The first path carries out a decimation filtering operation using even numbered coefficients and the second path carries out a decimation filtering operation using odd numbered coefficients. The two decimation filtering operations are carried out during sequential input samples. In so doing, storage registers can be shared across multiplication operations thereby reducing the number of registers required as shown in FIG. 9. It should be clear to a person of ordinary skill in the art that each delay block $z^{-1}$ in the block diagrams can be a register or a memory location in a Random Access Memory (RAM). More particularly, FIG. 9 shows the operations carried out by transpose-form decimation-by-two polyphase filter 700 having the number of registers reduced by a factor of 2.

Figure 10:
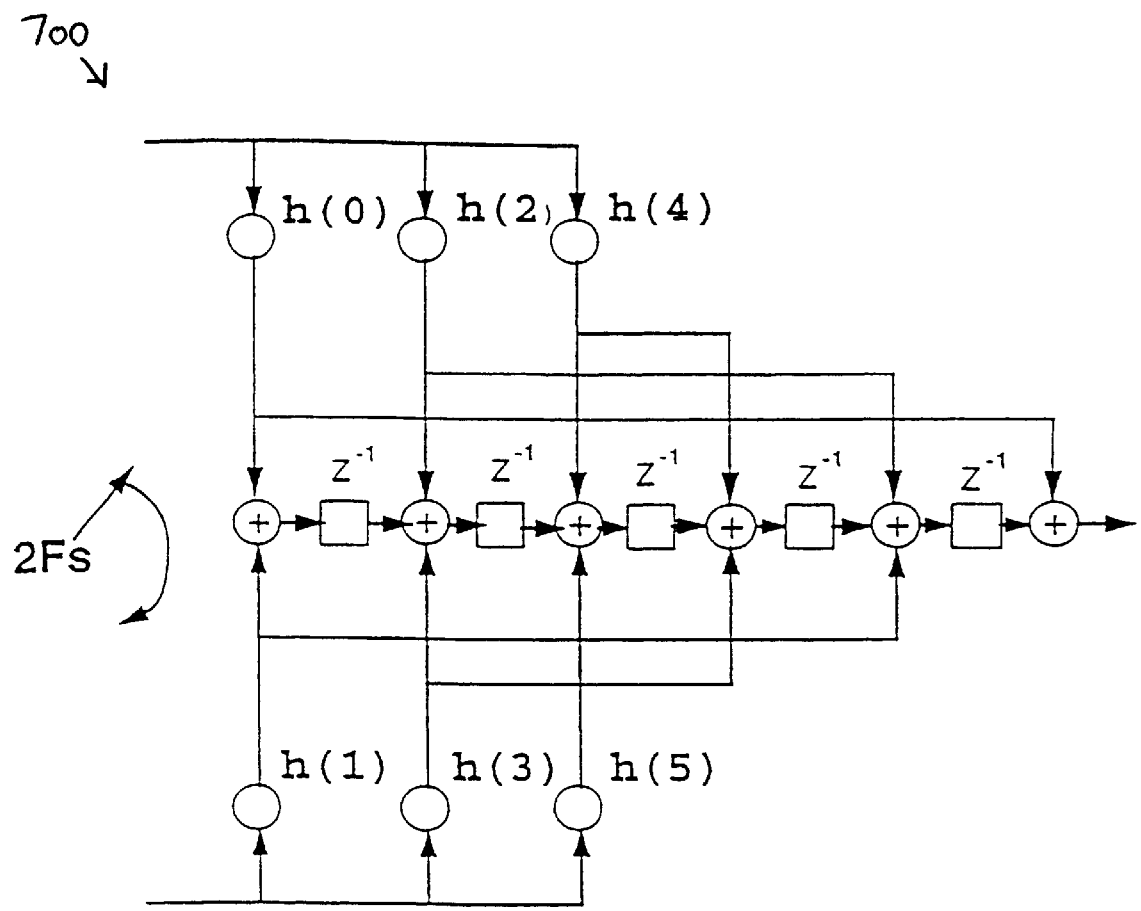
FIG. 10 illustrates the operations of decimation-by-two polyphase filter 700 having a reduced number of storage registers and a reduced number of multiplication operations in accordance with the present invention.

FIG. 10 illustrates the operations of decimation-by-two polyphase filter 700 having a reduced number of storage registers and a reduced number of multiplication operations in accordance to the present invention. FIG. 10 takes advantage of the coefficient symmetry feature and the concept of register sharing, which were discussed earlier, to achieve the registers and multiplication operations reduction. As a result, the number of storage registers is reduced by one-half and the number of multiplication operations is also reduced by one-half thereby improving the filter's efficiency.

Figure 11A:
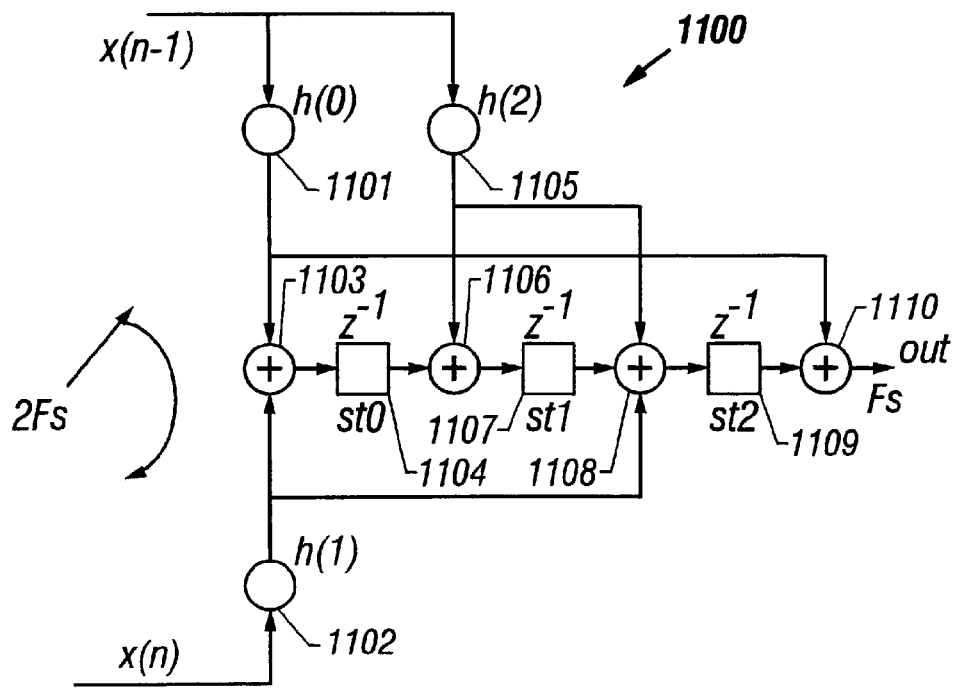
FIG. 11A illustrates the operations of an exemplary decision-by-two polyphase filter 1100 which is patterned after decimation-by-two polyphase filter 700 of FIG. 10.

Filters are called upon to perform increasingly more complex processing tasks. Accordingly, filters are becoming longer and more complex. As filters become more complex, it is desirable that to make their structure scalable to accommodate different complexity levels. Without scalability, a complex filter may require redesign from the ground up which may adversely impact time-to-market. At the same time, more complex processing generally means increased processing time. Hence, a filter structure that is scalable yet capable of achieving the required performance is desirable. In addition to the improvements discussed earlier to reduce the number of registers and multiplication operations required in the filter, the present invention provides for a scalable filter structure capable of parallel processing. Reference is now made to FIG. 11A, illustrating the operations of exemplary decimation-by-two polyphase filter 1100 which is patterned after decimation-by-two polyphase filter 700 described earlier in FIG. 10. However, filter 1100 has a reduced length and a reduced number of state coefficients in comparison to its counterpart filter 700. Such a simplified filter facilitates the understanding of the modifications made to attain the scalable filter structure under the present invention.

The transfer equation for decimation-by-two polyphase filter 1100 is:

$$H(z)=h(0)+h(1)z^{-1}+h(2)z^{-2}+h(1)z^{-3}+h(0)z^{-4}.$$

More particularly, filter 1100 carries out the operations as discussed below. It is to be appreciated that the operations can be carried out in any order and is therefore not limited to the following discussion. In operation 1101, filter 1100 multiplies input sampling signal x(n−1) by coefficient h(0). Filter 1100 multiplies input sampling signal x(n) by coefficient h(1) (operation 1102). The two products are then added together to generate state variable st0 in operation 1103. State variable st0 is then stored in a register in operation 1104. Input signal x(n−1) is multiplied by coefficient h(2) (operation 1105). State variable st0 is added to the product x(n−1)*h(2) in operation 1106 to generate state variable st1 which is stored in a register in operation 1107. In operation 1108, state variable st1, product x(n)*h(1), and product x(n−1)*h(2) are added together to generate state variable st2. State variable st2 is stored in a register in operation 1109. State variable st2 is added to product x(n−1)*h(0) to generate output signal y(n).

Figure 11B:
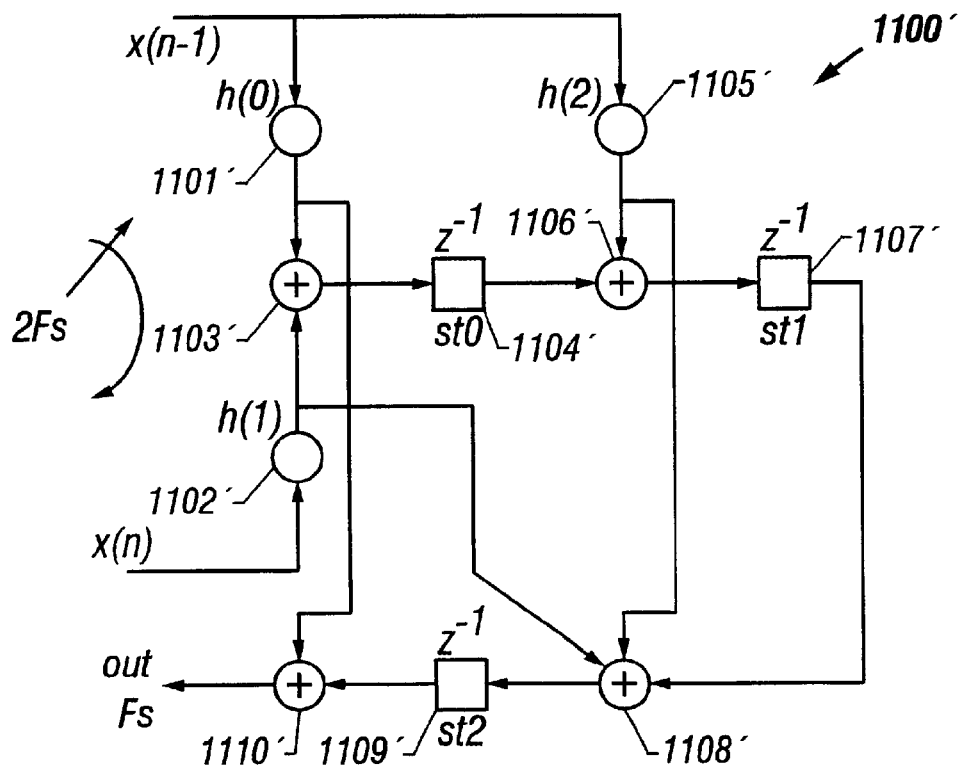
FIG. 11B illustrates the transformation of decimation-by-two polyphase filter 1100 to decimation-by-two polyphase filter 1100' that is readily combined with other similar units to create a more complex filter in accordance to an aspect of the present invention.

In FIG. 11B, decimation-by-two polyphase filter 1100 is transformed into a processing element (decimation-by-two polyphase filter 1100') that is readily combined with other similar units to create a more complex filter. In other words, the structure of decimation-by-two polyphase filter 1100' is scalable. Moreover, each unit is capable of processing data individually thereby allowing multiple units in a complex filter to carry out their processing independently, separately, and in parallel of each other. As demonstrated in FIG. 11B, the transformation is purely in form rather than in substance. Decimation-by-two polyphase filter 1100' still carries out the same operations as its counterpart decimation-by-two polyphase filter 1100. Accordingly, decimation-by-two polyphase filter 1100' has the same transfer equation as decimation-by-two polyphase filter 1100. In short, the components have only been rearranged cosmetically to more clearly demonstrate the scalability of the present invention. The substantial similarity between filters 1100 and 1100' is demonstrated by the operations that are carried out by the two filters. For ease of comparison with decimation-by-two polyphase filter 1100, the counterpart operations in decimation-by-two polyphase filter 1100' are referenced by corresponding primed numbers. For example, the counterpart of operation 1104 of decimation-by-two polyphase filter 1100 is operation 1104' of decimation-by-two polyphase filter 1100'.

Figures 12, 13:
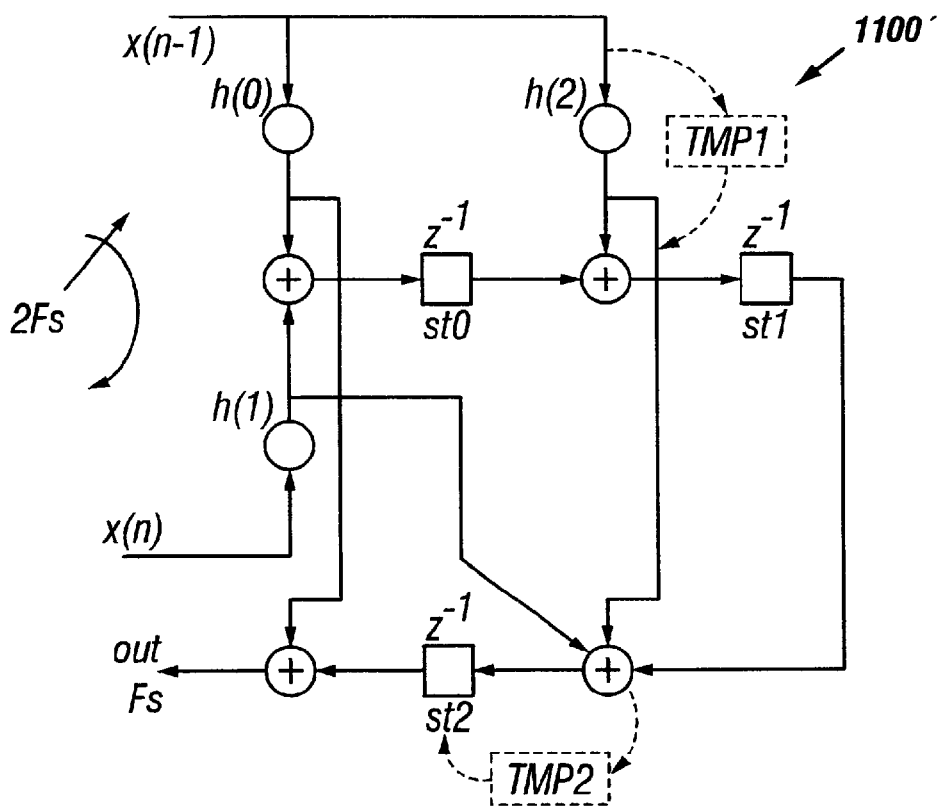
FIG. 12 illustrates the implementation of temporary registers tmp1 and tmp2 in filter 1100'.
FIG. 13 illustrates an exemplary computational sequence carried out by decimation-by-two polyphase filter 1100' with temporary registers tmp1 and tmp2.

In accordance to the present invention, decimation-by-two polyphase filter 1100' carries out a filtering computation sequence on input data received. The computation sequence can be efficiently carried out using only two temporary registers tmp1 and tmp2 regardless of the length of the filter. FIG. 12 illustrates the implementation of temporary registers tmp1 and tmp2 in filter 1100'. It is to be appreciated that under the present invention, only two additional registers are required to carry out even the most complex filtering computation sequence. As such, while the allocation and usage of temporary registers tmp1 and tmp2 offset the advantages of reducing the number of state variable registers, the overhead of two additional registers is very small in the case of a long and complex filter. In other words, in a large filter, a large number of state variable registers are eliminated to easily justify the usage of two temporary registers. Registers tmp1 and tmp2 are to be distinguished from registers that may be needed for purposes peripheral to the filtering computation including, for example, pipelining, memory access, and the like.

FIG. 13 illustrates an exemplary computational sequence carried out by decimation-by-two polyphase filter 1100' in performing its filter operation. As shown in the computation sequence of FIG. 13, registers tmp1 and tmp2 are added to temporarily store intermediate values that are needed for computation at different times in the computation sequence. It should be clear to a person of ordinary skill in the art that a myriad of other computation sequences may also be used to perform the filtering operation. The computation sequence illustrated in FIG. 13 is designed to perform a filtering operation using a reduced or minimum number of temporary registers. The computation sequence is also designed to perform computations in an optimum sequence to ensure that data is available when needed for subsequent computations while limiting the number of temporary storage elements. The computation sequence is also designed to avoid data conflicts such as over-writing a stored value that is needed for a subsequent calculation.

The computation sequence is designed to minimize the required number of functional units including multipliers, adders, and storage registers such as state variable registers and temporary registers. To minimize the number of storage registers, the computation sequence is further designed so that values are computed and made available when needed but preferably not before they are needed. Furthermore, since coefficient multiplication operations involving even and odd state variables (e.g., h(0), h(1), h(2), etc.) are carried out alternately, even and odd state variables can be stored in separate single-port registers or memories and there is no conflict in accessing the state variables. Accordingly, costs and access time can be minimized.

In the illustrative computation sequence, the h(2) coefficient is multiplied by the input signal and the product is stored in the temporary register tmp1 (step 1). As discussed earlier, register tmp1 is a holding register for holding various intermediate values in the filtering computation. The content of temporary register tmp1 is added to the value in state variable register st1 (1109') and the sum is stored in temporary register tmp2 (step 2). In step 3, the values of state variable st0 and the temporary register tmp1 are added together and the sum is then stored in the state variable registers st1.

In step 4, the h(0) coefficient is multiplied by the input signal and the product is stored in temporary register tmp1 thereby overwriting the coefficient product (h(2)*x(n−1)) which is no longer useful. The content of temporary register tmp1 is added to the value in state variable register st2 and the sum is then supplied to the output terminal out (step 5). In step 6, the content of temporary register tmp2 is stored in state variable register st2. In step 7, the current content of temporary register tmp1 is stored in the state variable register st0.

Odd coefficient h(1) is multiplied by the input signal x(n) and the product is stored in temporary register tmp1 thereby overwriting the product (h(0)*x(n−1)) which is no longer useful (step 8). In step 9, the present content of state variable register st0 and the present content of temporary register tmp1 are added and the sum is stored in the state variable register st0. In step 10, the contents of state variable st2 and temporary register tmp1 are added and the sum is stored in state variable register st2.

Figure 14:
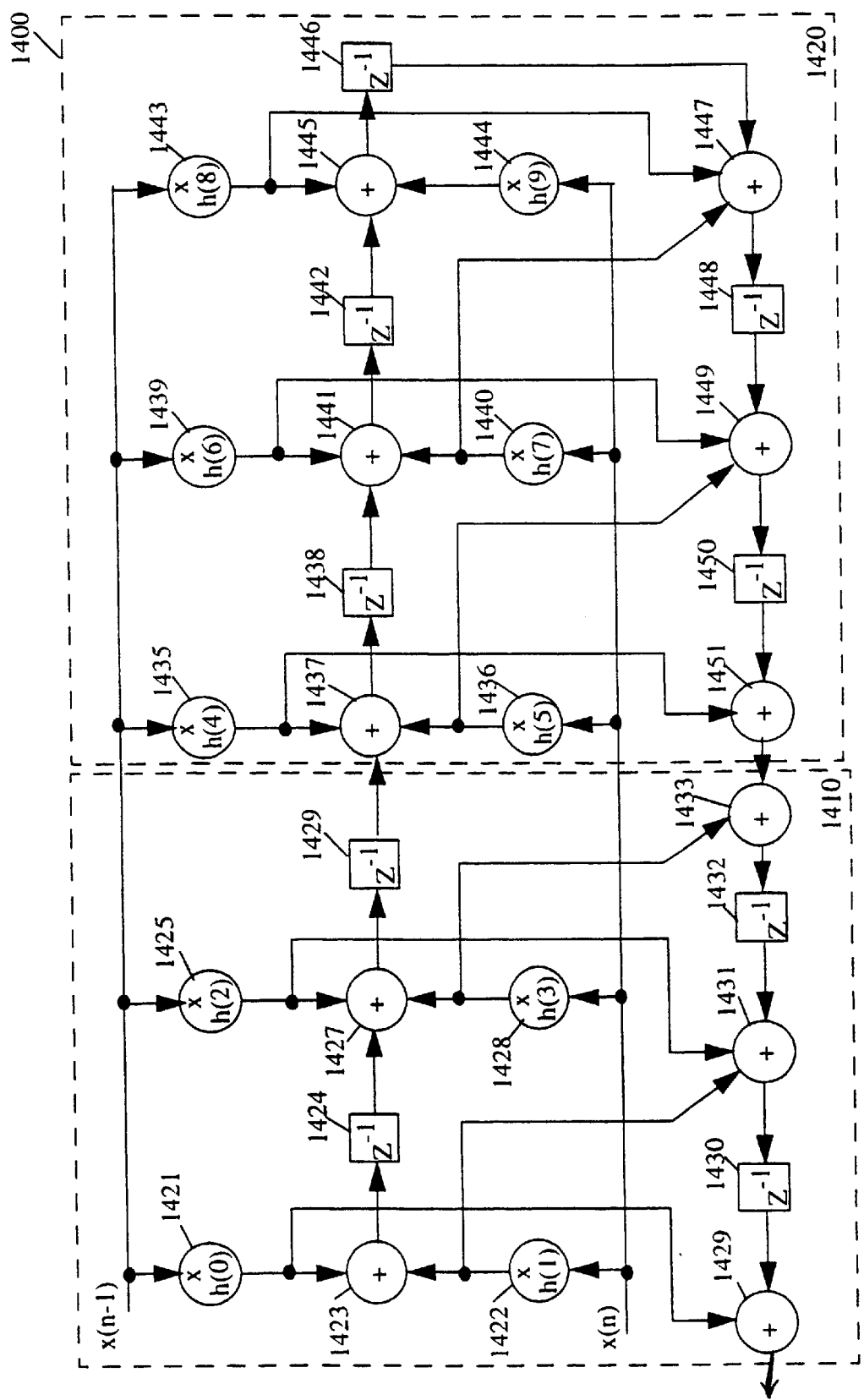
FIG. 14 illustrates as an example how two processing elements similar to decimation-by-two polyphase filter 1100' that are capable of parallel processing can be combined into a more complex filter in accordance to the present invention.

FIG. 14 illustrates as an example how two processing elements similar to decimation-by-two polyphase filter 1100' that are capable of parallel processing can be combined into a more complex filter in accordance with the present invention. FIR filter 1400 is a decimation-by-two linear-phase FIR filter having a length of 19. As shown in FIG. 14, processing elements 1410 and 1420 are combined together to form a more complex FIR processing element 1400. It should be clear to a person of ordinary skill in the art that despite a few minor modifications, processing elements 1410 and 1420 are substantially similar in operations and functions. Because processing elements 1410 and 1420 are substantially similar to decimation-by-two polyphase filter 1100' which was described earlier, for brevity and clarity, the details of processing elements 1410 and 1420 are not further described here. Rather, the overall connection between the two units and their parallel processing capability are discussed in greater detail below.

As shown in FIG. 14, both processing elements 1410 and 1420 receive as inputs sequential sample signals x(n−1) and x(n). The output of processing element 1410 is provided as an input to processing element 1420. The output of processing element 1420 is provided as an input to processing element 1410. It should be clear to a person of ordinary skill in the art that additional similar processing elements can be added at the right end of filter 1100' to create a longer and more complex (e.g., higher-order) filter by making similar connections discussed above without changing the structure and operations of existing processing elements.

By using the structure and connections of decimation-by-two polyphase filter 1400 discussed above and by arranging the computing steps of each processing element according to a desired computation sequence such as the exemplary computation sequence in FIG. 13, processing elements 1410 and 1420 can perform their filter processing independently and in parallel (a.k.a. parallel processing). Such parallel processing capability allows long and complex filters to be created without sacrificing their performance (e.g., speed). Since different processing elements may have different coefficients and different numbers of coefficients, their computation sequences may be different. This would be the case, for example, if the coefficients are implemented in canonic signed-digit form.

As such, decimation-by-two polyphase filter 1400 is a transpose-form filter that has an improved efficiency based on a reduction in the number of multiplications and the number of registers used to perform filtering operations. While a conventional FIR filter performs one multiplication operation for each addition of a coefficient-weighted sample, a decimation-by-two polyphase filter 1400 performs one multiplication for every two additions of coefficient-weighted samples. On the other hand, the number of registers are reduced by carrying out odd-order and even-order coefficient multiplication in alternating sample cycles.

Decimation-by-two polyphase filter 1400 is highly scalable by combining multiple processing elements (e.g., processing elements 1410 and 1420) to form higher-order filters. A further advantage is that decimation-by-two polyphase filter 1400 facilitates parallelization since the processing elements can operate independently and in parallel. The processing elements communicate only at the processing element boundaries. The shorter and smaller communication routes of the processing elements result in higher communication speeds, improved and efficient layout, and a reduced circuit area.

Figure 15:
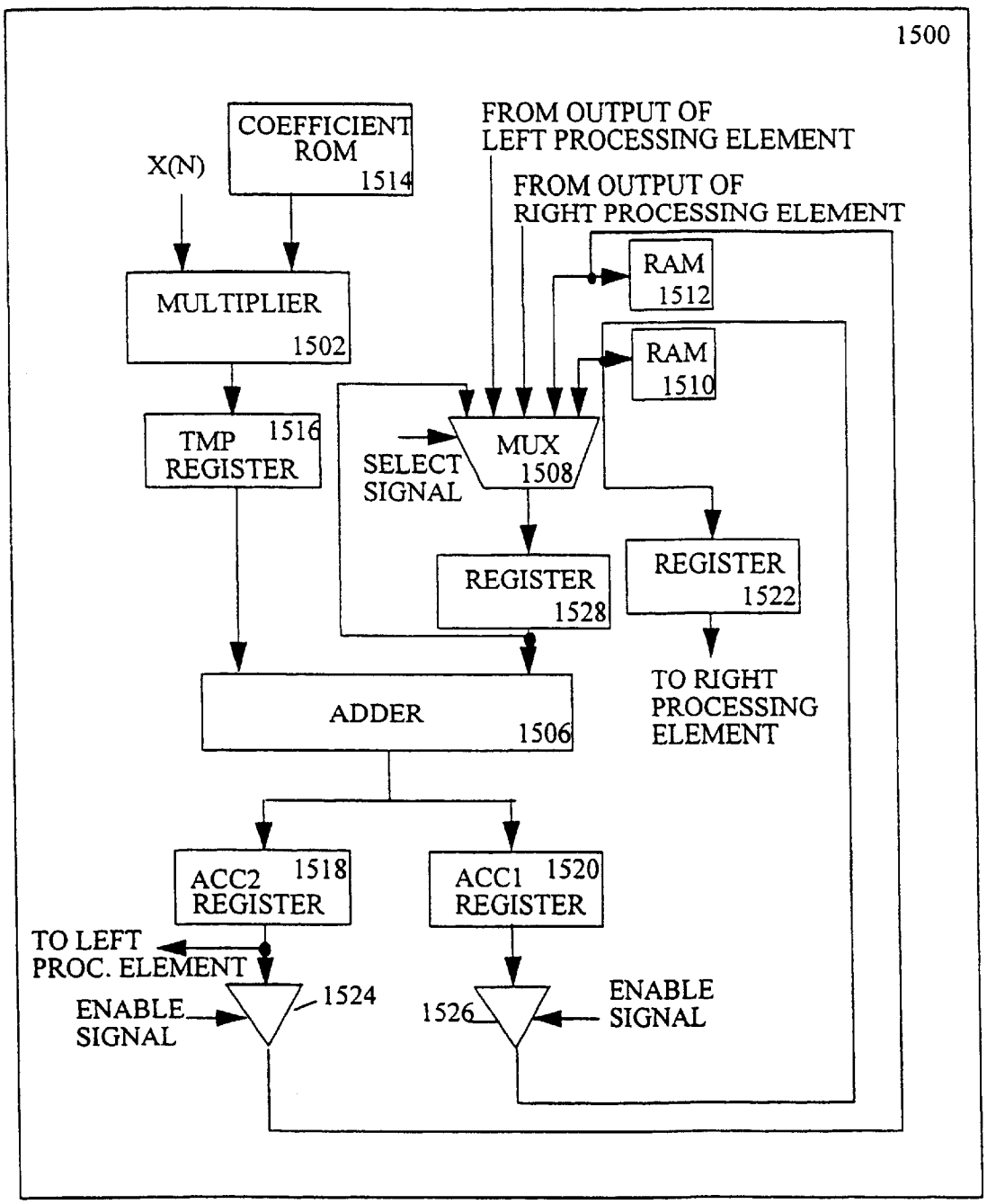
FIG. 15 illustrates an exemplary implementation of a processing element (e.g., processing element 1410 or 1420) in accordance to the present invention.

Referring now to FIG. 15 illustrating an exemplary implementation of a processing element (e.g., processing element 1410 or 1420) in accordance to the present invention. It should be clear to a person of ordinary skill in the art that the exemplary implementation can be used to implement processing element 1410 or processing element 1420. As shown in FIG. 15, the implementation utilizes multiplier 1502, adder 1506, multiplexer 1508, state variable Random Access Memory (RAM) 1510 and 1512, coefficient Read Only Memory (ROM) 1514, register tmp 1516, register acc2 1518, register acc1 1520, register 1522, register 1528, and tri-state buffers 1524 and 1526. In this embodiment, separate RAM 1510 and RAM 1512 are used to store state variables (e.g., st0, st1, st2, etc.) from a processing element (e.g., processing element 1410 or 1420). In so doing, single-port memory instead of dual-port memory can be used for RAM 1510 and 1512 while still maintaining separate and timely access to RAM 1510 and 1512. Generally, single-port memories are preferred over dual-port memories because dual-port memories are larger and more complex than single-port memories. However, being single-port memories, memory access operations are scheduled to avoid contention, for example to avoid a read operation and a write operation on the same memory in the same cycle. As a result, circuit resources are better conserved by utilizing single-port memories. RAM 1510 is used to store the processing element's upper (even order) state variables and RAM 1520 is used to store the processing element's lower (odd order) state variables in FIG. 14. It should be clear to a person of ordinary skill in the art that RAM 1510 and 1520 are used in place of the registers discussed in FIGS. 11–12 above.

Multiplier 1502 receives as input the input signal x(n) and the output of coefficient ROM 1514 which is used to store the unit filter's coefficients (e.g., h(0), h(1), h(2), h(3), etc.). Each input sample is multiplied by a corresponding coefficient retrieved from ROM 1514. Accordingly, multiplier 1502 is used to perform all multiplication operations in each processing element (e.g., processing element 1410 or 1420). The product is then stored in temporary register tmp 1516. The content of register tmp 1516 is provided as input to the adder 1506. Adder 1506 receives as a second input the output of multiplexer 1508 via register 1528. Multiplexer 1508 receives as input data from RAM 1510, RAM 1512, from the output of adjacent (left and right) processing elements, and from its own registered output (via register 1528). In response to a select signal, multiplexer 1508 allows one of its inputs to pass through as its output. Accordingly, multiplexer 1508 can select the value to provide as an input to register 1528 which in turn supplies the second input to adder 1506 thereby allowing the implementation to be used for any scalable processing element in a complex filter. Moreover, this allows adder 1506 to be reused in carrying out different addition operations at different times in the computation sequence. Adder 1506 adds its two inputs together and provides the sum as its output to register acc2 1518 and register acc1 1520. The output from register acc2 1518 is provided as input to buffer 1524. In response to an enable signal generated for example by a memory controller (not shown), buffer 1524 transfers its content to RAM 1512. The output from register acc2 1518 is also sent as an input to the adjacent left (immediately previous) processing element. Similarly, the output from register acc1 1520 is provided as input to buffer 1526. In response to an enable signal generated by a memory controller (not shown), buffer 1526 transfers its content to RAM 1510. The state variable value that has to be transferred to the adjacent right (immediately subsequent) processing element is stored in register 1522. This is needed because of the way the operation has been scheduled in the current implementation. The adjacent right processing element uses this value towards the end of its computation sequence and the processing element under consideration updates the same memory location at the beginning of its computation sequence. Since the adjacent right processing element needs the previously stored state variable value, that value has to be stored in register 1522 before it is updated in the processing element under consideration.

In so doing, the exemplary implementation allows computation operations in each processing element to be carried out in any desired sequence which enhances the parallel processing capability of each processing element. Each individual processing element has fast processing speed given small number of computations required and its small size (i.e., reduced distance for data transfer). When multiple processing elements are combined to create a more complex filter, the processing elements can operate independently and in parallel thereby optimizing the processing speed of the overall filter. Increasing the length of the filter would necessitate the usage of additional processing elements without any sacrifice in performance.

The present invention, an apparatus, method, and system to provide a scalable FIR filter architecture that requires fewer computations, less storage registers, and is capable of parallel processing, is thus described. While the present invention has been described in particular embodiments, the present invention should not be construed as limited by such embodiments, but rather construed according to the below claims.

What is claimed is:

1. A scalable Finite Impulse Response (FIR) filter comprising at least one decimation-by-2 processing element, the processing element receiving as input samples of an input signal at a predetermined rate, the processing element providing as output samples of an output signal that is half the predetermined rate, the processing element having a first and second sets of predetermined coefficients, the FIR filter is scalable by connecting a plurality of substantially similar decimation-by-2 processing elements to the at least processing element in series wherein the substantially similar processing elements are configurable to operate independently and in parallel, wherein the first processing element in the series computing a first value based on the first set of predetermined coefficients of the first processing element and the samples of the input signal, if the first processing element is connected to a subsequent neighbor processing element, the first processing element providing the first value to the subsequent neighbor processing element and receiving a second value from the subsequent neighbor processing element, wherein the first processing element computing a third value based on the second value, the second set of predetermined coefficients of the first processing element, and the samples of the input signal, if the first processing element is not connected to a subsequent neighbor processing element, the first processing element computing the third value based on the first value, the second set of predetermined coefficients of the first processing element, and the samples of the input signal, the subsequent neighbor processing element computing a fourth value based on the first value received from the first processing element, a first set of predetermined coefficients of the subsequent neighbor processing element, and the samples of the input signal, if the subsequent neighbor processing element is connected to another subsequent neighbor processing element, the subsequent neighbor processing element providing the fourth value to the another subsequent neighbor processing element and receiving a fifth value from the another subsequent neighbor processing element, the subsequent neighbor processing element computing the second value based on the fifth value, a second set of predetermined coefficients of the subsequent neighbor processing element, and the samples of the input signal, if the subsequent neighbor processing element is not connected to the another subsequent neighbor processing element, the subsequent neighbor processing element computing the second value based on the fourth value, a second set of predetermined coefficients of the subsequent neighbor processing element, and the samples of the input signal.

2. The FIR filter of claim 1, wherein each of the processing element is in transpose form, each of the processing element utilizing the transpose form to reduce the number of state variable storage elements, each of the processing element utilizing coefficient symmetry characteristics to reduce the number of multiplication operations.

3. The FIR filter of claim 2, wherein each processing element comprises:
   a first memory for storing the first and second sets of predetermined coefficients;
   a multiplier circuit receiving as inputs the input signal and coefficients stored in the first memory, the multiplier circuit performing multiplication operations involving sample values from the input signal and the coefficients;
   a first register coupled to the multiplier circuit for storing multiplication products from the multiplier circuit;
   a second memory for storing state variables of the processing element;
   a multiplexer circuit coupled to the second memory, the multiplexer circuit receiving as inputs output from a left adjacent processing element, output from a right adjacent processing element, the state variables from the second memory, the multiplexer circuit selecting one of the inputs for outputting;
   a second register for storing an output from the multiplexer;
   an adder circuit coupled to the first register and the second register, the adder circuit performing addition operations involving the multiplication products from the first register and output from the second register; and
   a third register coupled to the adder circuit and the second memory for storing addition sums from the adder circuit, the third register providing the addition sums to the second memory for storage as state variables.

4. The FIR filter of claim 3, wherein the second memory consists of two separate memories, each memory storing predetermined state variables.

5. The FIR filter of claim 4, wherein each processing element further comprises:
   a first tri-state buffer coupled to the third register for buffering the addition sums from the third register before transferring selected addition sums to one of the two separate memories of the second memory;
   a fourth register coupled to the adder circuit for storing addition sums from the adder circuit; and
   a second tri-state buffer coupled to the fourth register for buffering the addition sums from the fourth register before transferring selected addition sums to the other one of the two separate memories of the second memory.

6. The FIR filter of claim 5, wherein each processing element further comprises a fifth register coupled to the other one of the two separate memories of the second memory, the fifth register buffering the state variables retrieved from the other one of the two separate memories of the second memory prior to supplying to a subsequent neighbor processing element.

7. A sigma-delta analog-to-digital converter (ADC) comprising:
   a sigma-delta modulator receiving as input an analog signal, the sigma-delta modulator converting the analog signal into a digital signal having a sampling frequency;
   a decimation filter receiving as input the digital signal from the sigma-delta modulator, the decimation filter reducing the sampling frequency in the digital signal, the decimation filter comprising:
      filter comprising at least one decimation-by-2 processing element, the processing element receiving as input samples of an input signal at a predetermined rate, the processing element providing as output samples of an output signal that is half the predetermined rate, the processing element having a first and second sets of predetermined coefficients, the FIR filter is scalable by connecting a plurality of substantially similar decimation-by-2 processing elements to the at least processing element in series wherein the substantially similar processing elements are configurable to operate independently and in parallel, wherein the first processing element in the series computing a first value based on the first set of predetermined coefficients of the first processing element and the samples of the input signal, if the first processing element is connected to a subsequent neighbor processing element, the first processing element providing the first value to the subsequent neighbor processing element and receiving a second value from the subsequent neighbor processing element, wherein the first processing element computing a third value based on the second value, the second set of predetermined coefficients of the first processing element, and the samples of the input signal, if the first processing element is not connected to a subsequent neighbor processing element, the first processing element computing the third value based on the first value, the second set of predetermined coefficients of the first processing element, and the samples of the input signal, the subsequent neighbor processing element computing a fourth value based on the first value received from the first processing element, a first set of predetermined coefficients of the subsequent neighbor processing element, and the samples of the input signal, if the subsequent neighbor processing element is connected to another subsequent neighbor processing element, the subsequent neighbor processing element providing the fourth value to the another subsequent neighbor processing element and receiving a fifth value from the another subsequent neighbor processing element, the subsequent neighbor processing element computing the second value based on the fifth value, a second set of predetermined coefficients of the subsequent neighbor processing element, and the samples of the input signal, if the subsequent neighbor processing element is not connected to the another subsequent neighbor processing element, the subsequent neighbor processing element computing the second value based on the fourth value, a second set of predetermined coefficients of the subsequent neighbor processing element, and the samples of the input signal;

a timing and control circuit coupled to the decimation filter, the timing and control circuit providing timing for the digital signal; and a serial interface circuit coupled to the timing and control circuit, the serial interface circuit allowing the digital signal to be serially communicated to an external device.

8. The sigma-delta ADC of claim 7, wherein each of the processing element is in transpose form, each of the processing element utilizing the transpose form to reduce the number of state variable storage elements, each of the processing element utilizing coefficient symmetry characteristics to reduce the number of multiplication operations.

9. The sigma-delta ADC of claim 8, wherein each processing element comprises:

a first memory for storing the first and second sets of predetermined coefficients;

a multiplier circuit receiving as inputs the input signal and coefficients stored in the first memory, the multiplier circuit performing multiplication operations involving sample values from the input signal and the coefficients;

a first register coupled to the multiplier circuit for storing multiplication products from the multiplier circuit;

a second memory for storing state variables of the processing element;

a multiplexer circuit coupled to the second memory, the multiplexer circuit receiving as inputs output from a left adjacent processing element, output from a right adjacent processing element, the state variables from the second memory, the multiplexer circuit selecting one of the inputs for outputting;

a second register for storing an output from the multiplexer;

an adder circuit coupled to the first register and the second register memory, the adder circuit performing addition operations involving the multiplication products from the first register and output from the second register; and a third register coupled to the adder circuit and the second memory for storing addition sums from the adder circuit, the third register providing the addition sums to the second memory for storage as state variables.

10. The sigma-delta ADC of claim 9, wherein the second memory consists of two separate memories, each memory storing predetermined state variables.

11. The sigma-delta ADC of claim 10, wherein each processing element further comprises:

a first tri-state buffer coupled to the third register for buffering the addition sums from the third register before transferring selected addition sums to one of the two separate memories of the second memory;

a fourth register coupled to the adder circuit for storing addition sums from the adder circuit; and a second tri-state buffer coupled to the fourth register for buffering the addition sums from the fourth register before transferring selected addition sums to the other one of the two separate memories of the second memory.

12. The sigma-delta ADC of claim 11, wherein each processing element further comprises a fifth register coupled to the other one of the two separate memories of the second memory, the fifth register buffering the state variables retrieved from the other one of the two separate memories of the second memory prior to supplying to a subsequent neighbor processing element.

13. A method to provide a scalable FIR filter architecture that requires fewer computations, less storage registers, and is capable of parallel processing, comprising:

connecting substantially similar decimation-by-2 processing elements in series to provide processing scalability; and configuring the substantially similar processing elements so that the processing elements operating independently and in parallel;

wherein each processing element receiving as input samples of an input signal at a predetermined rate, each processing element providing as output samples of an output signal that is half the predetermined rate, each processing element having a first and second sets of predetermined coefficients, the FIR filter is scalable by connecting a plurality of substantially similar decimation-by-2 processing elements to the at least processing element in series wherein the substantially similar processing elements are configurable to operate independently and in parallel, wherein the first processing element in the series computing a first value based on the first set of predetermined coefficients of the first processing element and the samples of the input signal, if the first processing element is connected to a subsequent neighbor processing element, the first processing element providing the first value to the subsequent neighbor processing element and receiving a second value from the subsequent neighbor processing element, wherein the first processing element computing a third value based on the second value, the second set of predetermined coefficients of the first processing element, and the samples of the input signal, if the first processing element is not connected to a subsequent neighbor processing element, the first processing element computing the third value based on the first value, the second set of predetermined coefficients of the first processing element, and the samples of the input signal, the subsequent neighbor processing element computing a fourth value based on the first value received from the first processing element, a first set of predetermined coefficients of the subsequent neighbor processing element, and the samples of the input signal, if the subsequent neighbor processing element is connected to another subsequent neighbor processing element, the subsequent neighbor processing element providing the fourth value to the another subsequent neighbor processing element and receiving a fifth value from the another subsequent neighbor processing element, the subsequent neighbor processing element computing the second value based on the fifth value, a second set of predetermined coefficients of the subsequent neighbor processing element, and the samples of the input signal, if the subsequent neighbor processing element is not connected to the another subsequent neighbor processing element, the subsequent neighbor processing element computing the second value based on the fourth value, a second set of predetermined coefficients of the subsequent neighbor processing element, and the samples of the input signal.

14. The method of claim 13 further comprising the steps of:

utilizing the transpose form to reduce the number of state variable storage elements; and utilizing coefficient symmetry characteristics to reduce the number of multiplication operations.

* * * * *